United States Patent [19]
Bauser et al.

[11] Patent Number: 5,326,716
[45] Date of Patent: Jul. 5, 1994

[54] LIQUID PHASE EPITAXIAL PROCESS FOR PRODUCING THREE-DIMENSIONAL SEMICONDUCTOR STRUCTURES BY LIQUID PHASE EXPITAXY

[75] Inventors: Elisabeth Bauser; Horst P. Strunk, both of Stuttgart, Fed. Rep. of Germany

[73] Assignee: Max Planck-Gesellschaft zur Foerderung der Wissenschaften e.V., Goettingen, Fed. Rep. of Germany

[21] Appl. No.: 731,347

[22] Filed: Jul. 15, 1991

Related U.S. Application Data

[63] Continuation of Ser. No. 124,849, Sep. 29, 1987, abandoned.

[30] Foreign Application Priority Data

Feb. 11, 1986 [DE] Fed. Rep. of Germany ....... 3604260

[51] Int. Cl.$^5$ .................. H01L 21/20; H01L 21/208; H01L 21/82; C30B 19/00
[52] U.S. Cl. ....................................... 437/92; 437/130; 437/131; 437/128; 437/108; 437/111; 437/120; 437/915
[58] Field of Search .................. 430/130, 89, 92, 128, 430/126, 131, 915, 108, 111, 120; 148/DIG. 50, DIG. 148

[56] References Cited

U.S. PATENT DOCUMENTS

| | | | |
|---|---|---|---|
| 3,473,978 | 10/1989 | Jackson, Jr. et al. | 437/131 |
| 3,825,449 | 7/1974 | Marinelli et al. | 437/92 |
| 3,890,194 | 6/1975 | Ettenberg | 437/92 |
| 3,901,744 | 8/1975 | Bolger et al. | 437/92 |
| 3,935,040 | 1/1976 | Mason | 437/131 |
| 3,981,764 | 9/1976 | Ito et al. | 437/92 |
| 4,028,147 | 6/1977 | Kamath et al. | |
| 4,052,252 | 10/1977 | Lockwood et al. | 437/92 |
| 4,246,050 | 1/1981 | Moon | 437/108 |
| 4,274,890 | 6/1981 | Varon | 437/108 |
| 4,298,410 | 11/1981 | Nakajima et al. | 437/92 |
| 4,319,937 | 3/1982 | Holonyak et al. | 437/108 |

(List continued on next page.)

FOREIGN PATENT DOCUMENTS

| | | | |
|---|---|---|---|
| 0143957 | 6/1985 | European Pat. Off. | |
| 2936800 | 4/1981 | Fed. Rep. of Germany | 437/92 |
| 0005569 | 1/1978 | Japan | 437/92 |
| 0163835 | 12/1980 | Japan | 437/92 |
| 0066811 | 4/1985 | Japan | 437/131 |
| 0066812 | 4/1985 | Japan | 437/131 |
| 0105832 | 5/1986 | Japan | 437/131 |
| 2098614 | 5/1987 | Japan | 437/131 |

OTHER PUBLICATIONS

Grudeva et al., "Ge-Si Heterojunctions, Fabrication and Properties", Conference: Proceedings of the International Conference on the Physics and Chemistry of Semiconductor Heterojunctions and Layer Structures, Budapest, Hungary, (Oct. 11–17, 1970), pp. 155–164.

Cockayne et al., "Precipitate Identification in Ti-, Cr- (List continued on next page.)

Primary Examiner—Mary Wilczewski
Attorney, Agent, or Firm—Handal & Morofsky

[57] ABSTRACT

The present invention relates to a new application of the liquid epitaxial method, especially the manufacturing of epitaxial monocrystalline semiconductor layers having high crystalline perfection in multi-layer arrangements on an intermediate layer of an insulating material and/or carbon and/or metal for the manufacturing of a three-dimensional semi-conductor structure, in which low mechanical stresses are present and the charge carrier capacity is available between $10^{14}$ and $10^{21}$ per cubic centimeter, wherein very low process temperatures can be used, namely between 300° and 900° C. The seeding for the epitaxial layer is performed in openings made in the intermediate layer, wherein the monocrystalline material is exposed. From the openings the intermediate layers become overgrown laterally and in a monocrystalline fashion. The repeated application of the liquid epitaxy in the described fashion will permit a three-dimensional integration in monocrystalline multi-layer structures which are extremely devoid of defects.

27 Claims, 3 Drawing Sheets

U.S. PATENT DOCUMENTS

| | | | |
|---|---|---|---|
| 4,373,988 | 2/1983 | Bauser et al. | 156/622 |
| 4,521,447 | 6/1985 | Ovshinsky et al. | 437/131 |
| 4,522,661 | 6/1985 | Morrison et al. | 437/92 |
| 4,529,455 | 7/1985 | Bear et al. | 437/131 |
| 4,543,267 | 9/1985 | Yamazaki | 437/131 |
| 4,551,394 | 11/1985 | Betsch et al. | |
| 4,609,411 | 9/1986 | Kohashi et al. | 437/92 |
| 4,711,857 | 12/1987 | Cheng | 437/131 |
| 4,717,688 | 1/1988 | Jaentsch | 437/915 |

OTHER PUBLICATIONS and Ni-Doped InP Single Crystals", J. of Crystal Growth, vol. 76, 1986, pp. 251-258.

Japanese Journal of Applied Physics, Band 6, No. 7, Jul. 1967, (Tokyo, JP), T. Nakano.

Journal of the Electrochemical Society, Band 129, No. 12, Dec. 1982, (Manchester, N.H., US).

IBM Technical Disclosure Bulletin, Band 15, No. 3, Aug. 1972, (New York, US), J. M. Blum et al.

Journal of the Electrochemical Society, Band 133, No. 1, Jan. 1986, (Manchester, N.H., US), B. Jayant Baliga.

Applied Physics Letters, Band 38, No. 5, Mar. 1981, (New York, US), P. C. Chen et al.

Solid State Technology, Band 27, No. 9, Sep. 1984, (Port Washington, N.Y., US), L. Jastrzebski.

LIQUID PHASE EPITAXIAL PROCESS FOR PRODUCING THREE-DIMENSIONAL SEMICONDUCTOR STRUCTURES BY LIQUID PHASE EXPITAXY

This application is a continuation of application Ser. No. 124,849, filed Sep. 29, 1987 now abandoned.

TECHNICAL FIELD

The present invention relates to a new application of the liquid epitaxial method in the field of semiconductor manufacture.

BACKGROUND OF THE INVENTION

Methods and apparatus for the manufacturing of epitaxial layers by liquid epitaxial processes have been described in West German Patent 24 45 146 as well as in U.S. Pat. No. 4,373,988. In these methods and apparatus a substrate which is to be provided with an epitaxial layer is brought into a short time contact through centrifugal forces with a liquid, usually a metal melt which contains the layer material. Such methods and apparatus are also preferably used for the performing of the method according to the present invention.

SUMMARY OF THE INVENTION

The present invention relates also to semiconductor arrangements and structures which are manufactured with the help of the above described methods.

In its first aspect the present invention relates to the manufacturing of monocrystalline semiconductor materials in a multi-layer structure for three-dimensional integrated circuits, in which a further circuit layer having active components thereon is made over the nearly completed component layer. With three-dimensional integrated circuits the limitations of the presently practiced planar technique become eliminated, and which are conditioned by the following:

1. High demand on equipment when the structures are miniaturized substantially under one micrometer,
2. increase of the flow-path capacitance,
3. increase of the signal run-through time
4. punch-through effects, tunnel effects, injection of hot charge carriers and electromigration, etc., In addition to other advantages, such as functional reliability and an increase of the possibilities of switching concepts, different materials, such as gallium arsenide or germanium with its specific application possibilities (optoelectronics, Sensorics, etc.) can be included into the integration.

According to another aspect, the present invention relates to the manufacturing of certain especially (not necessarily) highly conducting epitaxial layers, which can be made into components of three-dimensional structures, and also can be used in semi-conductor components instead of the conventional contact layers.

In a first preferred embodiment of the inventive method for the manufacturing of a three dimensional semi-conductor structure, which possesses a high structural perfection and small mechanical stresses, onto an upper surface of a predetermined crystallographical orientation of a monocrystalline substrate an uninterrupted layer-like pattern comprising at least one material chosen from the group consisting of an insulating material, carbon, or metal, is placed. In the regions of the upper surface which are not covered by the pattern, a monocrystalline epitaxial layer is formed by means of liquid epitaxial process and which extends laterally at least over a portion of the pattern.

According to another embodiment of the present invention, onto a silicon substrate an epitaxial liquid process and epitaxial transition layer is deposited which comprises a germanium-silicon alloy and onto that an epitaxial layer from germanium or from a compound semiconductor is deposited, which is a compound comprising at least one element from the III-rd group and at least one element from the V-th group of the periodical system, and such deposition being performed also in a liquid epitaxial process. Preferably the germanium content of the transitional layer increases with an increasing distance from the silicon substrate. One may deposit the layer from the compound semiconductor also without a transitional layer onto the silicon substrate.

According to a further aspect of the present invention, onto a polycrystalline substrate, such as polysilicon, at least one layer from the substrate material or from a crystallographically tolerable material is placed by means of the liquid epitaxial process.

In a still further embodiment of the present invention, onto a substrate having a defined localized crystal defect, especially displacements, an epitaxial layer is placed preferably by means of a liquid epitaxial process. The substrate may contain a twin crystal or a twin plane having a very small angular displacement of the crystal plane in both crystal portions, wherein the angle should be preferably smaller than an angular minute.

Further advantages and features of the present invention will become more pronounced from the following description, in which embodiments of the present invention will be described in more detail with reference to the drawings, in which:

DESCRIPTION OF THE PREFERRED EMBODIMENTS

Figure 1:
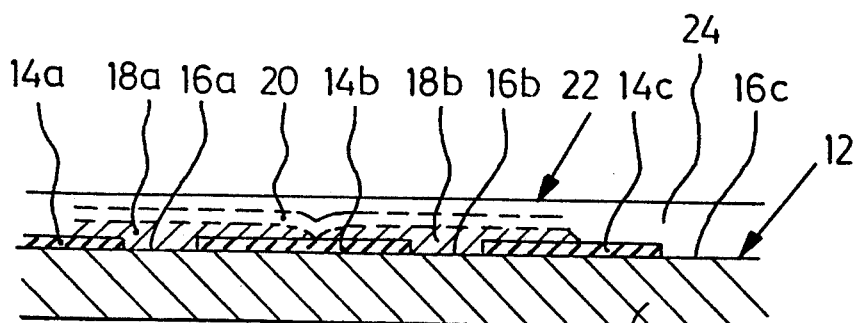
FIG. 1 is a strongly enlarged sectional view of a three-dimensional semiconductor structure according to one of the embodiments of the present invention during various stages of its manufacturing.

FIG. 1 illustrates an embodiment which shows how in a liquid epitaxial process a three-dimensional semiconductor structure or generally a crystal structure having a single corrector can be made with very low mechanical stresses and with a slight defect density between the various portions. The structure according to FIG. 1 comprises a monocrystalline substrate (10), which, for example, is made from a semiconductor material like silicon and shows a main surface (12), which crystallographically is oriented in such a fashion that the crystal growth velocity is smaller vertically with respect to the main surface (12) than in relation to the crystal growth velocity parallel with respect to the main surface (12). In case of silicon, the main surface (12) may, for example, lie in the crystallographical plane |111|. The surface 12 may have a slight defective orientation which is smaller than one angular degree, for example, 20', with respect to the pole |220|. In the case of Gallium-arsenide used as a substrate material, the planes |111| and |100| are suitable.

On the main surface (12) thin layers (14a, 14b, 14c . . . etc.), are placed in a strip pattern with narrow intermediate spaces (16a, 16b, 16c etc.) between said layers 14a . . . etc., the spaces 16a . . . etc. being narrow in relation to the strips 14a . . . etc. and in which the main surface is freely exposed. The spaces 16a . . . etc. being narrow in relation to the strips 14a . . . etc. means that the covered main surface area 12, under the strips of the strip pattern, is greater than the area of the exposed main surface 12. The layers (14) may obviously form a different pattern, which is necessary for a given three-dimensional structure, which, for example, can be an integrated opto-electronic circuit arrangement or a "multilevel" integrated circuit arrangement. The layers (14) may comprise silicon dioxide, which, for example, is manufactured by oxidation of the silicon substrate in a water steam atmosphere and which receives its last structural form by means of a conventional photolithographic etching process. Instead of silicon dioxide one may use also other insulating material such as silicon nitride or aluminum oxide ($AL_2O_3$) or also other carbon materials and finally also metals, such as tungsten, which at the temperatures used in the liquid epitaxial process will not go into reaction with the liquids (metal melts) used therein. The manufacturing of the layer pattern (14a . . . ) can be made in a process suitable for the layer material, such as oxidation in situ, sputtering, by vaporization or by a similar manner. The layer pattern may consist also from parts made from various materials, such as from insulating layers or metallic layers.

The substrate may contain zones having different conductivity type, which have been manufactured, for example, by diffusion in planar technique or by some other suitable manner and form together with the pattern layer an integrated circuit. Such integrated circuit may become contacted through contact surfaces on the edges and/or through etched-through holes and, in the final product of the process represents a first circuit plane, which is separated from the subsequently placed semiconductor material, as far as required, by insulating portions in the intermediate layer.

Onto the exposed regions of the main surface (12), in the intermediate spaces 16 between the strips 14, now an epitaxial layer is brought to growth in a liquid epitaxial process. Here one may use, for example, a metal melt, which may contain indium, gallium, bismuth, lead, zinc or antimony as a solvent material and silicone as the dissolved material. The solvent will define in general the conductivity type of the epitaxially growing layer, that is, in case of indium and gallium a p-conductivity layer will grow and in case of antimony and bismuth a n-type conductivity layer will grow. A n-type conductivity layer may also be produced with indium, zinc or lead as the solvent, then additionally phosphorus or arsenic is used as the doping material in the solvent, since the built-in coefficients of the phosphoric or arsenic are substantially higher than those of indium or lead and, the conductivity type will be determined accordingly by the phosphorus or by the arsenic.

By using indium as the solvent one will operate generally with temperatures 550° and 1000° C., wherein the indium doping of the epitaxially growing silicon layer will increase with additional temperature increase. With indium as the solvent one may then attain doping material concentrations of $10^{15}$–$10^{18}$ per cubic centimeter. Very strongly conductive and highly complex layers which are very suitable as contact paths or similar, will be obtained by the growth from a gallium solution. Also with phosphorus or arsenic as the doping material one may attain a doping material concentration up to and over $10^{20}$ donors per cubic centimeter.

With gallium as the solvent one may operate preferably in the temperature range between about 300° and 800° C. In this case the acceptor concentrations can be reached up to and above $10^{21}$ per cubic centimeter.

Figure 2:
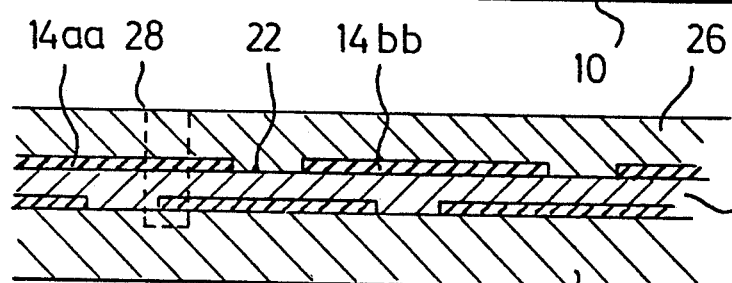
FIG. 2 is a further three-dimensional semiconductor structure according to a further embodiment of the present invention.

The building of the epitaxial layers on the freely exposed regions of the main surface (12) will occur preferably due to the fact that the used melt is introduced onto the substrate by means of centrifugal forces, as is described in the patents mentioned in the introductory part. The epitaxial growth commences in the intermediate spaces (16a . . . ) and the epitaxial layers will grow sideways over the layers (14a, 14b . . . ), as is illustrated by the dashed regions (18a, 18b etc.). When the epitaxial deposition of the silicon occurs from the melt then the regions (18a, 18b) will grow continuously together into a monocrystalline layer (20) and very quickly a smooth upper surface (22) will be formed at that location. In the event the process is interrupted at this point, then one will obtain a substrate (10) which will have a predetermined basic conductivity type (and it may contain an integrated circuit with zones of opposite conductivity type and zones of different conductive capability) and which will carry an epitaxially grown layer (24). Between the substrate (10) and the layer (24) is the pattern from the layers (14a, 14b . . . ). The process can be continued in an appropriate manner as shown in FIG. 2. One may produce also in the epitaxial layer (24) by diffusion or photolithography a further integrated circuit plane and onto the upper surface (22) a further layer pattern (14aa, 14bb, etc.) can be placed. Subsequently one may grow a further epitaxial layer (26) etc.

The substrate (10) and the layers (24, 26) may possess a desired conductivity type and also, for example, a npn-structure or something similar. By etching out trenches, one may, as shown in FIG. 2, at (28) subdivide the structure in a desired manner and in a given case, obtain contact with deeper-lying regions or zones. The deeper-lying regions may be contacted by, for example, by being filled up epitaxially with highly doped semiconductor material.

Figure 3A:
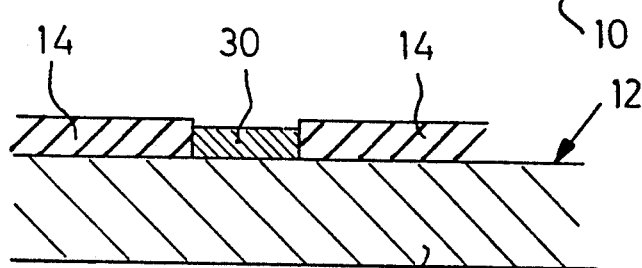
FIG. 3 consisting of FIGS. 3A to FIG. 3C, illustrates a three-dimensional semiconductor structure according to an embodiment of the present invention during various stages of its manufacturing.
Figure 3B:
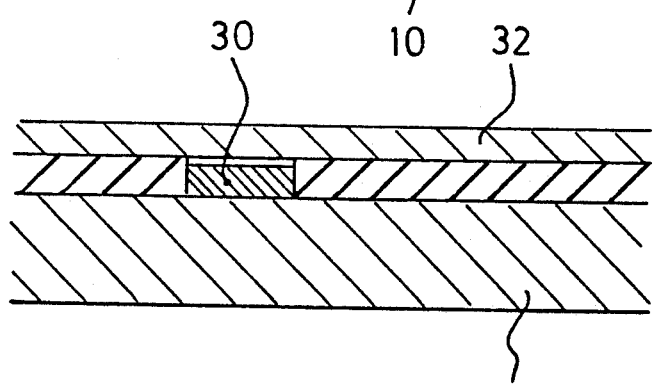
Figure 3C:
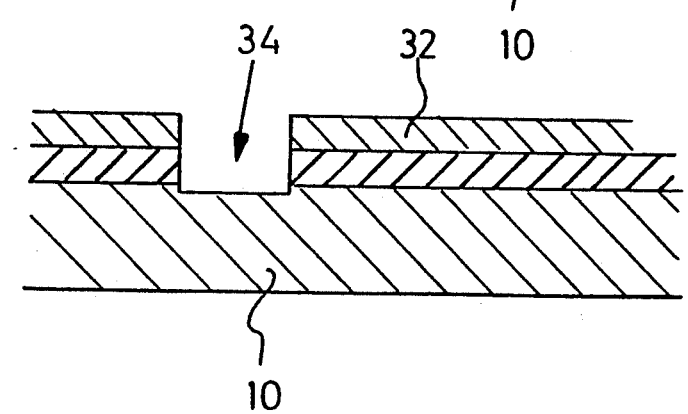

As can be seen in FIGS. 1 and 2, the substrate and the epitaxial layers (24) and (26) are made from the same material, for example, from silicon. This is however, not necessary, one may manufacture in most instances also three-dimensional heterostructural devices. An example for such types is illustrated in FIGS. 3A through 3C. In such examples it has been assumed, that a heterostructure is manufactured from an elementary semi-conductor, such as silicon and a semi-conductor composition especially the $A_{III}B_V$-type composite, such as GaAs, GaAsP, GaAlP etc., for example, from a substrate (10) which comprises monocrystalline silicon and a main surface (12) which is in the crystallographical plane |111| or in the plane |100|. The epitaxial layer should be made, for example, from gallium arsenide, so that the ready three-dimensional structure could be, for example, used for an integrated opto-electronic circuit, in which one purely electronic member of the integrated circuit is formed in the silicon substrate (10) and a similarly opto-electronic member is formed in the epitaxial gallium arsenide layer.

Since silicon and gallium arsenide possess different lattice constant, a matching is suitable. This will occur in the embodiment according to FIG. 3 in that onto the freely exposed regions of the upper surface (12) first by a liquid epitaxial process a matching layer, for example, from a silicon-germanium alloy will be grown, the germanium content of which preferably will increase with an increasing distance from the upper surface (12), which can be attained by controlling the temperature during the liquid epitaxial process or by the formation of several super-imposed epitaxial layers with solvents which contain different quantities of silicon and germanium. The matching layer (30) will be more germanium rich with being an increasing distance from the main surface (12) and the germanium possesses a lattice constant which matches very well the gallium arsenide, it enables to place onto the matching layer (or layers) (30) in a manner described with respect to FIG. 1 an epitaxial gallium arsenide layer (32) by means of liquid epitaxial process. Now, if necessary, the silicon substrate (10) could be separated from the monocrystalline epitaxial gallium arsenide layer (32) by an etched trench (34), as illustrated in FIG. 3C.

Figure 4:
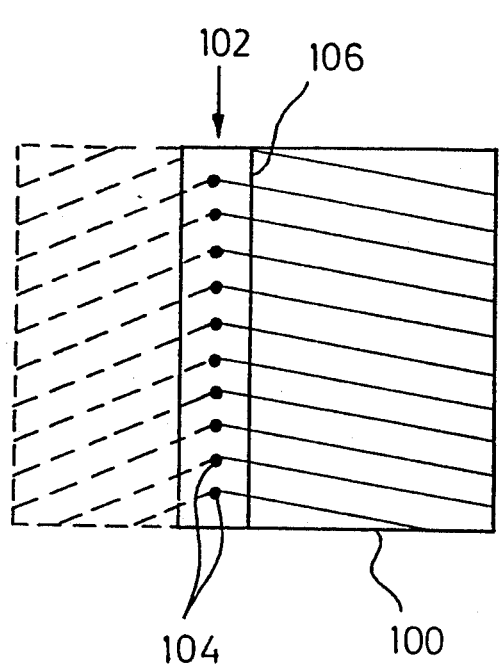
FIG. 4 is an especially advantageous substrate according to the present invention for the liquid epitaxial process.

An increase of the germanium concentration with an increasing distance from the main surface (12) can be attained, for example, by using an indium melt saturated with silicon and germanium wherein the epitaxial growth is commenced at a temperature of about 700° C. and the temperature thereafter is gradually decreased to about 500° C. Especially homogeneous epitaxial layers can be obtained when a substrate is used which contains defined, possibly regularly distributed nucleation centers, such as shiftings, like step-wise displacements. This can be attained by that one should use a bicrystal with a very small angle between the crystallographic surfaces of the adjacently lying crystal regions, such as illustrated in FIG. 4. FIG. 4 illustrates a substrate crystal (100), which consists of two crystals, which are joined with each other at a grain boundary (102) and at that point the crystal planes of both crystal regions, as illustrated with the dashed lines, form with each other a very small angle, such as an angle having the magnitude of one angular minute or less, for example, 20 angular seconds. On the grain boundary step-wise displacements become formed, the penetrations of which are shown by the points (104) in FIG. 4. Such step-wise displacements and penetration points represent preferred starting points for the epitaxially grown crystal and, when using a substrate according to FIG. 4 the grain boundary (102) will grow a completely uniform crystallization front (106) having steps of atomic height above the substrate upper surface, whereby an extraordinarily homogeneous epitaxial layer having a very fine and uniform distribution of the built-in doping atoms and a very smooth upper surface has been created. This is of very importance for highly integrated circuits having an extremely dense component presence.

Figure 5:
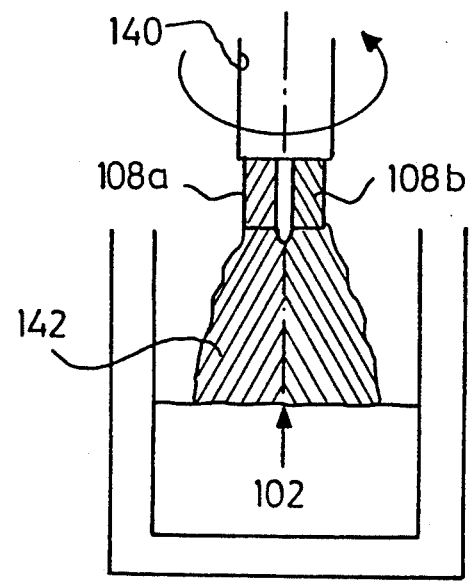
FIG. 5 illustrates in a schematic fashion the manufacturing of a crystal member, from the substrate of the type illustrated in FIG. 4.

Substrate crystals of the type illustrated in FIG. 4 can be manufactured by means of crystal growing in a somewhat different Czochralski method, as illustrated in FIG. 5. One will use two seed or injection crystals (108a, 108b), which are secured in an offset orientation which is in the magnitude of a fraction of an angular minute on a rotatable pull or supporting bar (140). On the injection crystal (108a, 108b), at the beginning separate individual crystals will start to grow which soon will grow together and form a continuous or cohesive twin or bicrystal (142) from which then the substrate according to FIG. 4 can be cut out, wherein the grain boundary (102) may lie on the edge of the substrate or also in the middle of the substrate. The substrates as shown in FIGS. 4 and 5 can be used obviously for a different epitaxial process with appropriate advantages.

Figure 6:
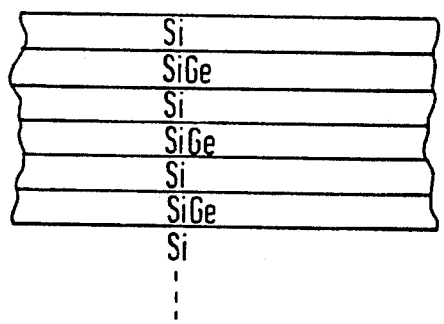
FIG. 6 is a partial view of a further semiconductor structure according to an embodiment of the present invention.

A further advantageous application of the liquid epitaxial process is the manufacturing of the so-called cross-gridding with mechanical straining (strained superlattices), which may contain for example 50 to 100 layers made up from alternating silicon and a silicon germanium alloy (for example having 30 to 50% germanium), as schematically illustrated in FIG. 6.

The layers in this case can have a thickness of about 1–1000 atom positions, which can be attained in a liquid epitaxial process by transporting the solution by means of centrifugal force.

By liquid epitaxial process one may manufacture also silicon germanium mixed crystals with a predetermined band gap having a suitable layer sequence, for example, the so called direct semiconductors, in which the charge carrier transition between the conductive region and the valent region occurs without phonon exchange, can be realized with elementary semi-conductor materials.

When zinc and in certain cases lead is used as the solvent, layers with very high ohmic value can be produced.

Figure 7:
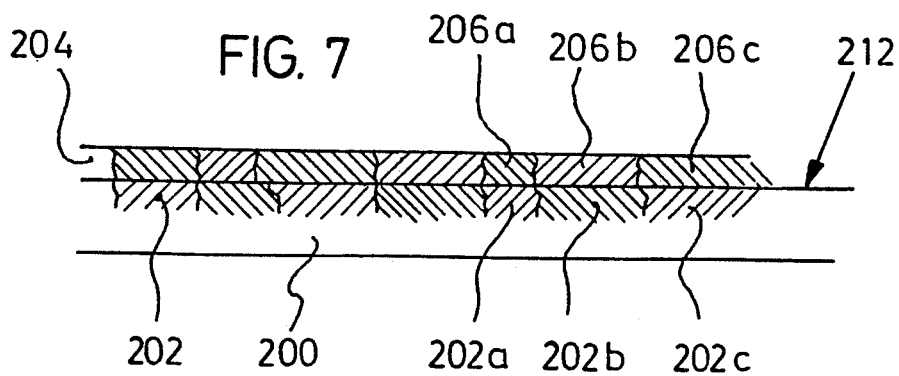
FIG. 7 is a sectional view of a structure having polycrystalline substrate manufactured according to one of the embodiments of the present invention.

A further very advantageous application of the liquid epitaxial process can be found in the manufacturing of polycrystalline epitaxial layers on a polycrystalline substrate, for example, poly-silicon. Poly-silicon in many instances is used for the manufacturing of solar cells. As can be seen in FIG. 7 by the use of liquid epitaxial process for the manufacturing of polycrystalline pn-structures, a substrate (200) from poly-silicon is used which has an upper surface (212) onto which a plurality of crystal regions (202) are joined. On the upper surface (212) a layer (204) is made in liquid epitaxial process which layer will contain corresponding epitaxial crystal regions (206a, 206b, 206c etc.). A substrate may consist, for example, from a p-type conductive poly-silicon and the layer (204) may be 0.3–10 μm thick, and consist of n-silicon, and contain, for example, $10^{18}$ donors per cubic centimeter and being made by means of an indium-phosphorus alloy.

The use of phosphorus as an alloying component, such as a doping material, has the advantage that the oxide layers which in spite of the conventional upper surface cleaning with chemical etching by hydrofluoric acid and the subsequent plasma etching in a hydrogen atmosphere prior to the epitaxial layering and performed in a few mm Hg pressure, become reformed on it, will not cause any disturbance since the phosphorus has a larger affinity for the oxygen than the silicon and the oxide becomes thereby reduced.

The following table will give examples of indium phosphorus alloys and of an indium-gallium alloy as well as the charge carrying densities and growing temperature ranges attained thereby.

| Solvent Indium with | Charge carrier density of the Si-epitaxial layer (CM$^{-3}$) | Growing Temperature Range (°C.) |
|---|---|---|
| 0 at % Phosphorus | p $1 \times 10^{16}$ | 950–750 |
| $4 \times 10^{-4}$ at % Phosphorus | n $3 \times 10^{17}$ | 950–750 |
| $2 \times 10^{-3}$ at % Phosphorus | n $4 \times 10^{19}$ | 790–720 |
| $1 \times 10^{-7}$ at % Phosphorus | n $6 \times 10^{19}$ | 790–740 |
| $2 \times 10^{-2}$ at % Phosphorus | n $8 \times 10^{19}$ | 790–740 |
| $2 \times 10^{-1}$ at % Gallium | p $6 \times 10^{16}$ | 950–750 |

In liquid epitaxial process there is no need for temperature gradients along the upper surface of the substrate. Since the growing temperatures lie relatively low, there are little mechanical strains present, therefore in contrast to the earlier diffusion or similarly manufactured zone structures and similar devices, the epitaxial layers manufactured by the growing are negligently influenced. One may even produce practically intrinsically conducting, very high ohmic layers, or very poorly doped layers having a low conductivity as well as very highly doped layers, which possess a very high electrical conductivity. Furthermore, the layers produced by the liquid epitaxial process are practically free of defects and can be produced with a smooth upper surface in the atomic scale. By an appropriate selection of the concentration of the dissolved materials, layers with relatively low charge carrier density can be produced, which can be desirable in a large number of cases.

FIGS. 8A–8D illustrate the manufacturing of a three-dimensional "Mesa"-type structure having several layers, which can be deposited selectively without masking.

Figure 8A:
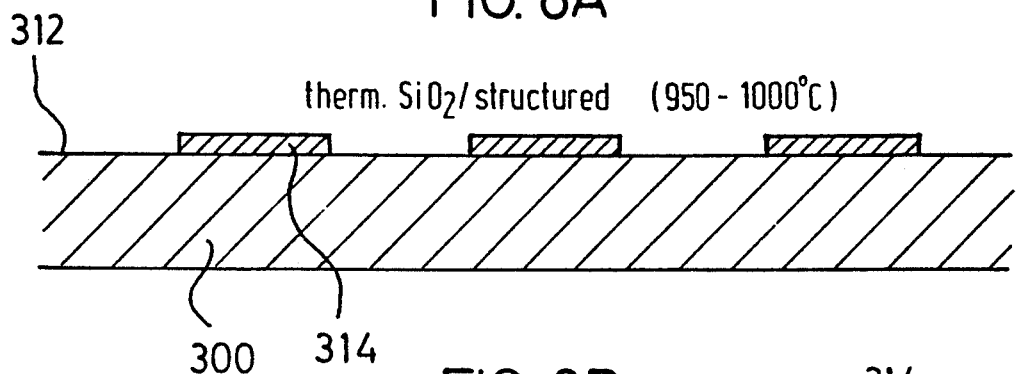
FIG. 8 consisting of FIGS. 8A to FIG. 8D, illustrates in sectional view a further three-dimensional structure manufactured according to one of the embodiments of the present invention.
Figure 8B:
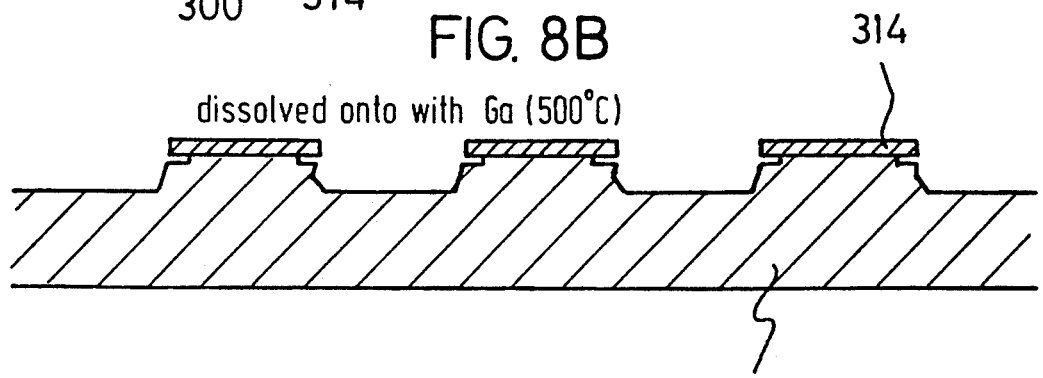
Figure 8C:
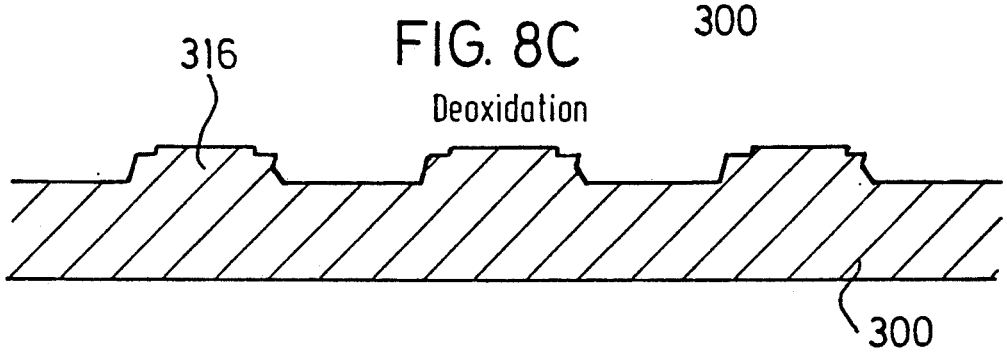
Figure 8D:
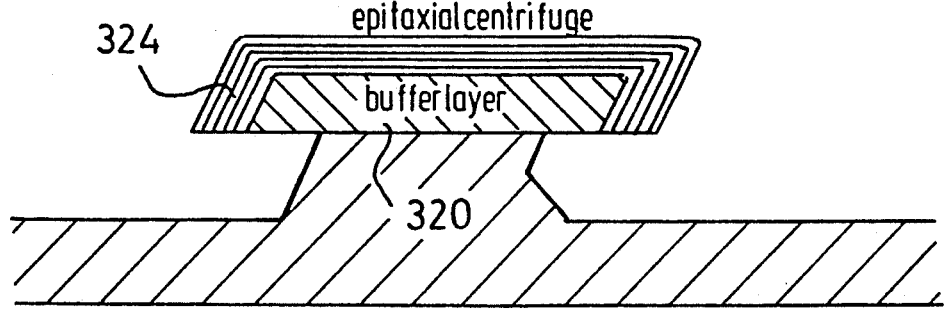

For the initial material serves a monocrystalline silicon substrate (300) having an upper surface (312), which runs in a plane |111|. On the upper surface (312) there are formed by thermal oxidation and photolithographic etchings, strips (314) from silicon dioxide. The edges which run vertically with respect to the plane of the drawing (314) are so laid out that they run parallel with the section line of the growing surface with a grid plane |110|. Subsequently the freely-lying silicon in the recesses between the oxide strips (314) becomes dissolved in gallium at about 500° C. up to a depth of about 60 μm. Due to the low temperature during the dissolving, trenches are formed with a clearly marked crystallographically oriented edges. Subsequently the substrate then becomes cleaned from the oxide layers (314). On the strips (316; FIG. 8C) which have been freed from the oxide layers (314) first a lower layer (320) from silicon is grown having a thickness of about 20 μm and onto this layer alternatingly 25 p-conductive and 25 n-conductive individual layers (324) are placed, each of which has a thickness of 300 nanometer by using an epitaxial centrifuge deposition described in the earlier mentioned patent literature. It is a remarkable result that the epitaxial growth occurs exclusively in the obtained regions of the strip-like profiled crystals. The selective epitaxial layering is performed also without a masking layer.

We claim:

1. A method of manufacturing a three-dimensional semiconductive structure comprising a substrate having an active component connectable in a first circuit and at least one layer of a semiconductor material, said semiconductor layer having an active component connectable in a second circuit, having high structural perfection and having low mechanical stresses, said method comprising the steps of:
   (a) providing a substrate having a surface, said substrate surface being crystallographically oriented in such a fashion that during crystal growth, crystal growth velocity is smaller perpendicularly to said surface as compared to crystal growth velocity parallel to said surface,
   (b) depositing a mask pattern on said substrate surface, said mask pattern having mask pattern portions masking areas of said surface and narrow intermediate spaces between said mask portions, said intermediate spaces being narrower than said mask portions whereby said surface is exposed in said spaces to have an exposed area less than that of said masked areas; and
   (c) by means of liquid-phase epitaxy from solution, growing said semiconductor material on said surface exposed between said mask portions and over said mask pattern portions to form said semiconductor layer.

2. A method as claimed in claim 1, wherein said semiconductor layer is monocrystalline and has a thickness and a varying composition, said varying composition being a function of distance from said substrate throughout said monocrystalline layer thickness.

3. A method as claimed in claim 2, wherein said varying composition is achieved by repeating said liquid-phase growing step with differing compositions.

4. A method as claimed in claim 2, wherein said varying composition is achieved by varying the temperature at which said liquid-phase growing step is conducted.

5. A method as claimed in claim 1, wherein said semiconductor layer is a monocrystalline layer formed from a material selected from the group consisting of germanium and a compound semiconductor material containing at least one of the elements in periodic table group III and at least one element from periodic table group V.

6. A method as claimed in claim 1, wherein said substrate is a bicrystalline substrate, with portions having a twin-plane or a small angle grain boundary.

7. A method as claimed in claim 1, wherein said substrate is made of silicon; said semiconductor material is silicon, and said substrate surface is a |111| crystallographic plane.

8. A method as claimed in claim 1, wherein said substrate is made of gallium arsenide; said semiconductor material comprises gallium and arsenic; and said substrate surface is a crystallographic plane selected from the group consisting of the |111| plane and the |100| plane.

9. A process as claimed in claim 1, wherein said mask pattern comprises an interrupted layer-like pattern formed of at least one material selected from the group consisting of carbon, insulator material and metal.

10. A process as claimed in claim 1, wherein said substrate comprises an integrated circuit structure and said semiconductor material is selected from the group consisting of germanium and a compound semiconductor containing at least one element from group III and at least one element from group V of the periodic system, and wherein said semiconductor material is used to form another integrated circuit structure.

11. A process according to claim 1, comprising depositing, in a liquid epitaxial process, between said substrate and said semiconductor layer, an epitaxial transitional layer providing a transition of lattice constants and made from a germanium-silicon alloy.

12. A process according to claim 11, wherein said transitional layer has an increasing germanium content with increasing distance from said substrate.

13. A process as in claim 1, wherein said semiconductor material is grown as a thin epitaxial semiconductor layer and said growing step is repeated alternately with materials having different lattice constants to produce multiple thin semiconductor layers.

14. A process according to claim 13, wherein each said thin semiconductor layer is grown with a thickness between 1 and 1000 atoms.

15. A process according to claim 13 wherein growing is done alternately with silicon and a silicon-germanium alloy.

16. A process according to claim 15, wherein said silicon-germanium alloy comprises 30 to 50% germanium.

17. A liquid epitaxial process as in claim 1, wherein said liquid-phase epitaxy-growing solution comprises a material selected from the group consisting of indium, gallium, antimony, bismuth, zinc, aluminum, and lead, as a solvent for said semiconductor material.

18. A process according to claim 17, wherein said solvent has a composition selected in such a manner that said grown semiconductor layer has a charge carrier density meeting a criterion selected from the following group:
 a) the charge carrier density assumes values under $10^{14}$ per cubic centimeter;
 b) the charge carrier density assumes a desired value between $10^{14}$ and $10^{20}$ per cubic centimeter; and
 c) the charge carrier density assumes a value greater than $10^{20}$ per cubic centimeter.

19. A process according to claim 1, wherein said solvent material is selected from one of the following groups:
 a) mainly indium, zinc or lead;
 b) the components of indium, gallium, antimony, bismuth, zinc and lead in an appropriate mixture relationship; and
 c) mainly gallium and respectively phosphorous and-/or arsenic in high concentration;
respectively, according to said respective desired charge carrier density criterion a), b) or c).

20. A process as claimed in claim 19, wherein said substrate is a polycrystalline polysilicon material.

21. A process as claimed in claim 1, wherein said substrate is polycrystalline and said semiconductor material is selected from the group consisting of said polycrystalline substrate material and crystallographically comparable materials.

22. A process as claimed in claim 1, wherein said substrate has defined localized crystal defects.

23. A process according to claim 22, wherein said substrate is bicrystalline with portions having a twin-plane or small angle grain boundary with very small angular displacement of the crystal planes of both crystal portions.

24. A process according to claim 23, wherein said angle is smaller than one angular minute.

25. A method according to claim 1 being a spin liquid-phase epitaxy method, said semiconductor substrate having high structural perfection, which method includes providing a liquid solution of a semiconductor material in a solvent, causing said solution to flow over said substrate by means of centrifugal forces, and providing each said circuit structure layer with contact means for individual connection of said layers in circuit.

26. A method according to claim 1 wherein said mask pattern portions are strips of insulator material.

27. A method according to claim 1 comprising growing said semiconductor layer to form a smooth surface extending across at least one mask portion.

* * * * *